United States Patent
Verlinden et al.

(10) Patent No.: US 6,387,726 B1
(45) Date of Patent: May 14, 2002

(54) METHOD OF FABRICATING A SILICON SOLAR CELL

(75) Inventors: Pierre J. Verlinden, Palo Alto; Akira Terao, Cupertino, both of CA (US); Haruo Nakamura, Wako (JP); Norio Komura, Wako (JP); Yasuo Sugimoto, Wako (JP); Junichi Ohmura, Wako (JP)

(73) Assignees: Sunpower Corporation, Sunnyvale, CA (US); Honda Giken Kogyo Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/474,760

(22) Filed: Dec. 30, 1999

(51) Int. Cl.[7] ............................................. H01L 21/00
(52) U.S. Cl. ...................... 438/98; 430/270.1; 257/41
(58) Field of Search ............................. 438/57, 63, 98, 438/73, 100, 101, 83, 43, 96; 136/243, 244, 256; 257/41, 458; 528/353; 430/270.1

(56) References Cited

U.S. PATENT DOCUMENTS

| | | | |
|---|---|---|---|
| 4,234,352 A | | 11/1980 | Swanson |
| 4,927,770 A | | 5/1990 | Swanson |
| 5,756,650 A | * | 5/1998 | Kawamonzen et al. ..... 528/353 |
| 6,159,654 A | * | 12/2000 | Machida et al. ......... 430/270.1 |
| 6,274,402 B1 | * | 8/2001 | Verlinden et al. ............. 438/98 |

* cited by examiner

Primary Examiner—Carl Whitehead, Jr.
Assistant Examiner—Calvin Lee
(74) Attorney, Agent, or Firm—Arent Fox Kintner Plotkin & Kahn, PLLC

(57) ABSTRACT

A method of fabricating a back surface point contact silicon solar cell having p-doped regions and n-doped regions on the same side by forming a passivating layer on a surface of the cell having opened windows at the p-doped regions and the n-doped regions, by depositing and patterning a first metal layer on the passivating layer in such a way that the first metal layer comes into contact with the p-doped regions and the n-doped regions, by depositing an insulator layer of polyimide on the first metal layer, by etching and patterning the insulator layer of polyimide in such a way that the insulator layer has opened windows at, at least one of the p-doped regions and the n-doped regions, by curing the insulator layer of polyimide by heating at temperature for a period, by additionally curing the insulator layer of polyimide by heating at a second temperature, which is higher than the first temperature, and by depositing a second metal layer made of metal stack on the insulator layer of polyimide in such a way that the second metal layer comes into contact with the one of the p-doped regions and the n-doped regions. With this, the cell surface to be soldered onto a metallized substrate is well planarized and even to ensure sufficient conductibility, with less voids and less solder fatigue.

4 Claims, 14 Drawing Sheets

FIG. 7

| CHARACTERISTICS | SIO₂ | POLYIMIDE | SIO₂ + POLYIMIDE COMBINATION |
|---|---|---|---|
| PLANARIZATION | NOT GOOD | VERY GOOD | VERY GOOD |
| PINHOLE FREE | NO | ALMOST YES | YES |
| MOISTURE BARRIER | YES | NO | YES |
| STEP COVERAGE PROBLEM FOR 2ND METAL LAYER | COULD BE | COULD BE | NO |
| VOID FORMATION DURING SOLDERING | YES | YES | NO |
| STRESS OR SOLDER FATIGUE DUE TO SEVERE TOPOGRAPHY | COULD BE | COULD BE | NO |
| REDUNDANT PATTERNING (DEFECT FORGIVING) | NO | NO | YES |

METHOD OF FABRICATING A SILICON SOLAR CELL

BACKGROUND OF THE INVENTION

1. Field of the Invention

This invention relates to a method of fabricating a solar cell, and more particularly to a method of fabricating a back surface point contact silicon solar cell.

2. Description of the Related Art

The silicon solar cell generates electrical charge when exposed to solar radiation. The radiation interacts with atoms of the silicon and forms electrons and holes which migrate to p-doped and n-doped regions in the silicon body and create voltage differentials between the doped regions. U.S. Pat. No. 4,234,352 discloses a solar energy convertor which includes a parabolic cone radiation concentrator portion and a processor portion including a radiator that absorbs concentrated radiation and generates incandescent radiation. A silicon solar cell receives the incandescent radiation and generates the voltage differentials between the doped regions. U.S. Pat. No. 4,927,770 discloses a back surface point contact silicon solar cell to be suitable for the concentrator solar cell.

Since the concentrator solar cells generate a lot of current (e.g., 10 $A/cm^2$ or more for concentration×200 to 500) and have a low voltage (e.g., 0.8 V), the series resistance of the solar cell must be small (such as less than 0.003 Ω-cm). To attain this very low value of series resistance, the metallization of the solar cell should have a double layer of metallization as described in the aforesaid patent (U.S. Pat. No. 4,927,770).

In this kind of solar cell, the first layer of metallization contacts the semiconductor positive and negative contacts (the p-doped and n-doped regions) in a very fine pattern to insure a high efficiency under high concentration. The second layer of metallization maintains a low series resistance and must be solderable. In between these two layers of metallization, there must be a layer of an insulator (dielectric) material such as silicon oxide or alumina oxide as is disclosed in the aforesaid patent (U.S. Pat. No. 4,927, 770).

In the concentrator silicon solar cell, because of the high concentration ratio (e.g., ×200 to 500, or incident power density of 20 to 50 $W/cm^2$), the first metal layer is very thick (e.g., 2 to 4 $\mu m$). This high thickness of the first metal layer and the intermetal insulator may sometimes make proper deposition of the second thin metal layer (e.g., 1 to 2 $\mu m$) over the patterned insulator layer difficult, causing the second metal layer to have poor conductivity or worse, to break.

Moreover, when soldering the cell onto a metallized substrate (made of aluminiumnitride (ALN) or alumina ($Al_2O_3$), for example), the formation of voids (i.e., bubbles, pinholes or cracks) is much greater on a non-smooth cell surface. In other words, less voids will happen during soldering when the cell surface is well planarized. Also, the solder fatigue due to the difference in thermal expansion is much less on the smooth surface than on a surface with severe topography (unevenness). Thus, the surface of the cell to be soldered onto a metallized substrate should preferably be as planarized and even as possible.

SUMMARY OF THE INVENTION

An object of this invention is therefore to provide an improved method of fabricating a silicon solar cell having a double layer of metallization, whose surface to be soldered onto a metallized substrate is well planarized and even to ensure sufficient conductibility, with less voids and less solder fatigue.

In order to achieve this object, there is provided a method of fabricating a silicon solar cell having p-doped regions and n-doped regions on a same side, comprising the steps of: (a) forming a passivating layer on a surface of the cell having opened windows at the p-doped regions and the n-doped regions; (b) depositing and patterning a first metal layer on the passivating layer in such a way that the first metal layer comes into contact with the p-doped regions and the n-doped regions (c) depositing an insulator layer of polyimide on the first metal layer; (d) etching and patterning the insulator layer of polyimide in such a way that the insulator layer has opened windows at, at least one of the p-doped regions and the n-doped regions; (e) curing the insulator layer of polyimide by heating at a predetermined first temperature for a predetermined first time; (f) additionally curing the insulator layer of polyimide by heating at a predetermined second temperature, which is higher than the predetermined first temperature, for a predetermined second time; and (g) depositing a second metal layer on the insulator layer of polyimide in such a way that the second metal layer comes into contact with the one of the p-doped regions and the n-doped regions.

BRIEF EXPLANATION OF THE DRAWINGS

This and other objects and advantages of the invention will be more apparent from the following description and drawings, in which:

FIG. 7 is a table showing the comparison of characteristics of materials to be used in the insulator layer referred to in the process according to the third embodiment of the invention;

DETAILED DESCRIPTION OF THE PREFERRED EMBODIMENTS

Figure 1A:
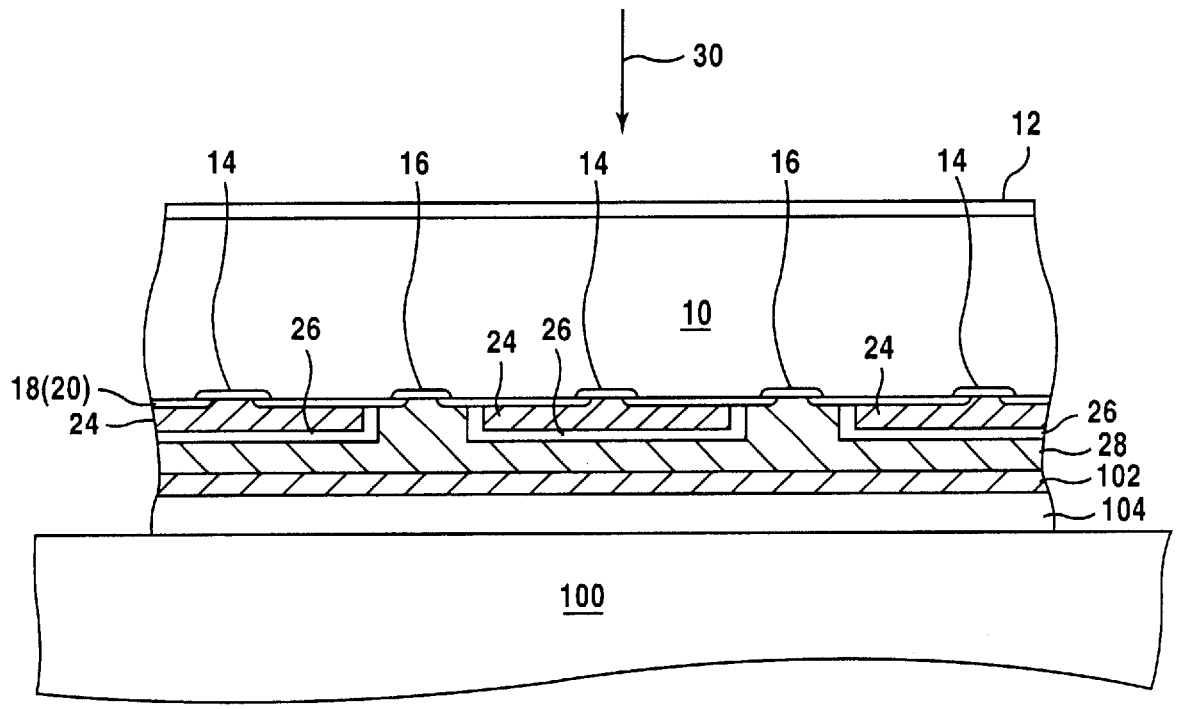
FIG. 1A is a schematic cross-sectional view of a prior art back surface point contact silicon solar cell having a double layer of metallization disclosed in U.S. Pat. No. 4, 927,770.

An embodiment of the invention will now be explained with reference to the attached drawings.

FIG. 1 is a cross-sectional schematic view illustrating a back surface point contact silicon solar cell fabricated in the manner taught by U.S. Pat. No. 4,927,770, employing the double layer of metallization.

The cell includes a single-crystal silicon substrate 10 having a resistance of approximately 200 Ω-cm. The top surface of the substrate 10 has a passivating layer 12 of silicon oxide, and the bottom surface includes alternating n-doped regions 14 and p-doped regions 16. The bottom surface between the diffused regions 14, 16 is coated with a first passivating layer 18 of silicon oxide and a second passivating layer 20 of silicon nitride (illustrated as a whole in the figure).

The cell has a first metal layer 24, comprising sputtered aluminum for example, formed over the passivating layer to contact with the n-doped region 14, an insulator (dielectric) layer 26 deposited on the first metal layer 24 and a second metal layer 28 made of a metal stack comprising aluminum and etc., deposited thereon to contact with the p-doped region 16, as will later be explained in detail.

Specifically, the solar cell is then mounted on a metallized substrate 100 through a solder layer 102 and a layer 104. More specifically, the solar cell is soldered onto the contacts 104 of the metallized substrate 100.

In the structure, the solar radiation is concentrated through a concentrator such as illustrated in U.S. Pat. No. 4,234,352 by×200 to 500 (20 to 50 W/cm$^2$) and as shown in FIG. 1A, the concentrated solar radiation indicated by reference numeral 30 enters the silicon substrate 10 from the top surface and interacts with atoms of the silicon substrate 10 and forms electrons and holes which migrate to the n-doped and p-doped regions 14, 16 respectively in the silicon substrate 10 and create voltage differentials between the doped regions 14. The resulting voltage differentials are taken from the contacts 104.

The structure of the solar cell shown in FIG. 1A is known and the gist of the invention resides in the fabrication of the same.

Figure 1B:
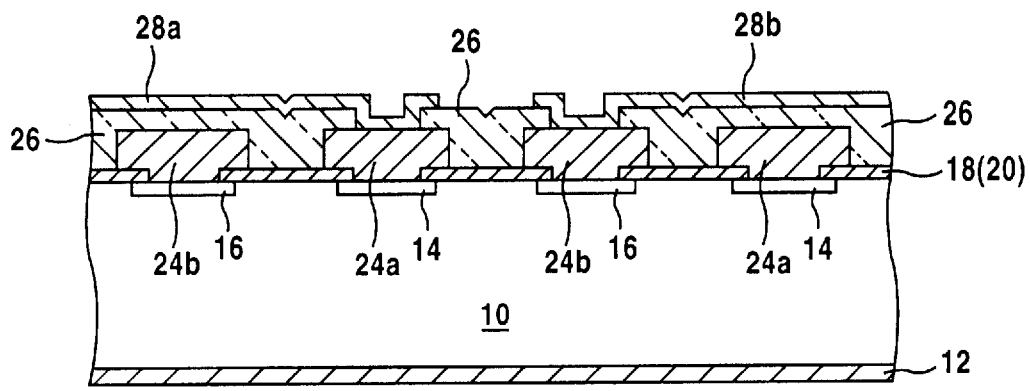
FIG. 1B is a view, similar to FIG. 1A, but showing a back surface point contact silicon solar cell having a double layer of metallization according to the invention.

It should be noted however that, for ease of understanding, in FIG. 1A, the first metal layer 24 is illustrated to come into contact with only the n-doped regions 14, while the second metal layer 28 is shown to come into contact with only the p-doped regions 16. As shown in FIG. 1B, the first metal layer 24 is, in fact, brought into contact with both n-doped regions 14 and p-doped regions 16 and is patterned in such a way that the n-doped regions 14 and the p-doped regions 16 are isolated from each other. The second metal layer 28 contacts the p-doped regions 16 by contacting the first metal layer 24 in regions where it contacts the p-doped regions 16.

Also for the sake of simplicity, FIG. 1A only shows the regions of the solar cell where only the p-doped regions 16 are contacted to the second metal layer 28. In fact, as illustrated in FIG. 1B, there are other regions of the cell where only the n-doped regions 14 are contacted to the second metal layer 28a. The second metal layer 28 is thus opened between these two regions by patterning it in such a way that no n-doped region 14 is contacted to a p-doped region 16.

Figure 2:
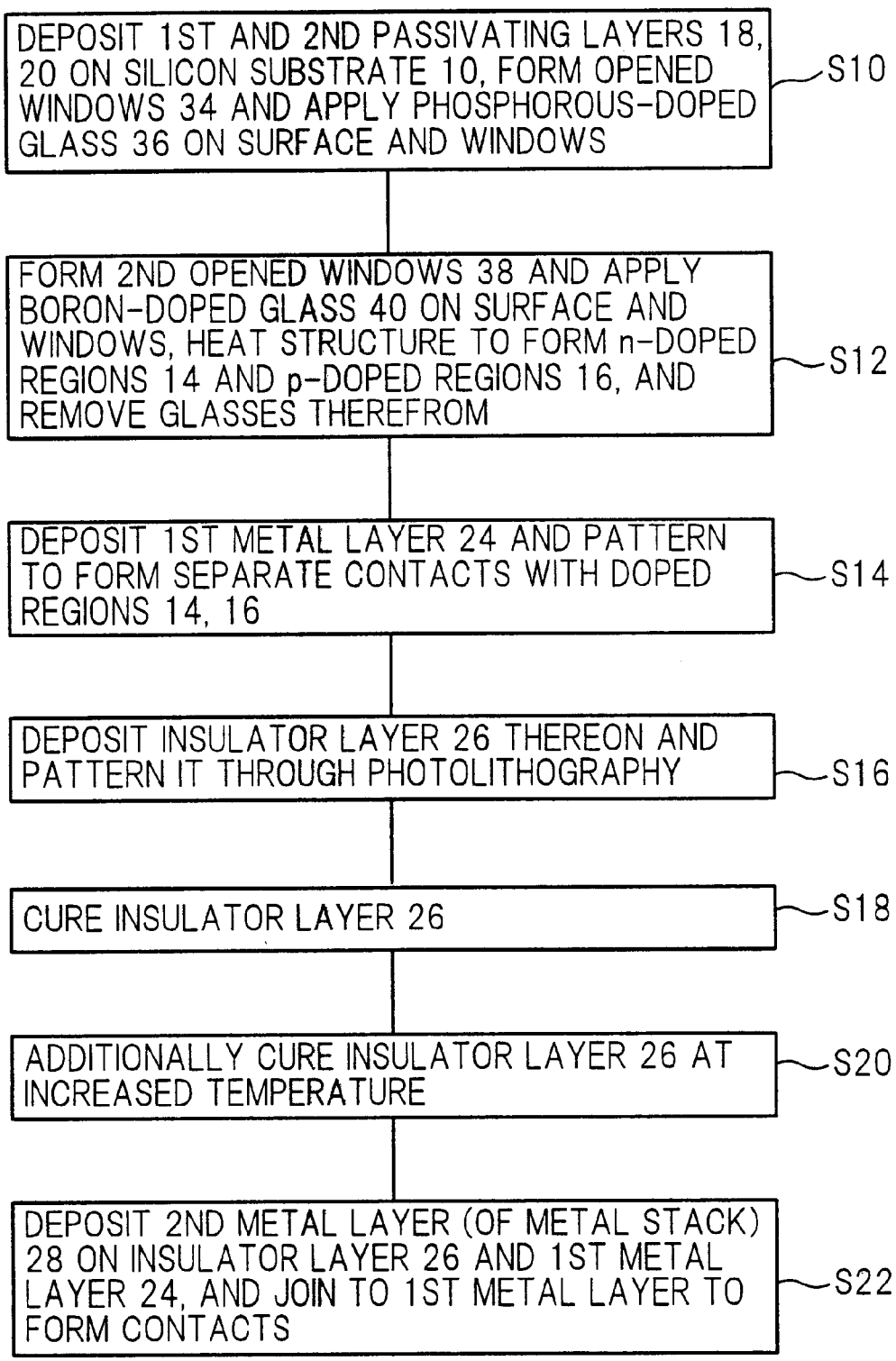
FIG. 2 is a process flow chart illustrating the process to fabricate the silicon solar cell (of FIG. 1B) according to the invention.

FIG. 2 is a process flow chart illustrating the process to fabricate the back surface contact point silicon solar cell (illustrated in FIG. 1B) according to the invention and FIG. 3A–3H are sectional views explaining the process shown in FIG. 2. It should be noted here that the cell is turned bottom side up and the thicknesses and shape of portions are often deformed for illustration purpose in FIG. 3A and on.

Figure 3A:
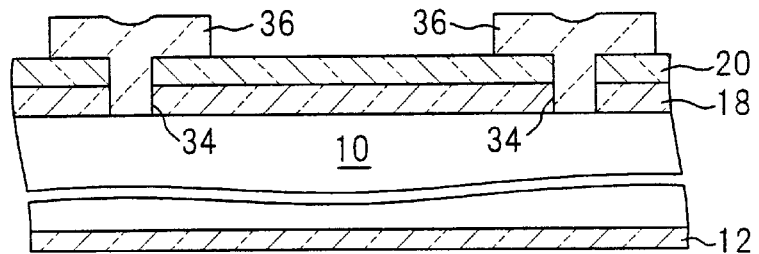
FIGS. 3A–3H are sectional views of the silicon solar cell explaining the process shown in FIG. 2.

The process begins in S10 in which, as shown in FIG. 3A, the silicon substrate 10 is deposited with the first passivating layer of silicon oxide 18 and is deposited with the second passivating layer of silicon nitride 20 on the top surface of layer 18, while the substrate 10 is formed with the passivating layer 12 at its top. Then, opened windows 34 are formed through the first and second layers 18, 20 to expose surface portions on the substrate 10, and phosphorus-doped glass 36 is applied to the second layer 20 and into the opened windows 34.

Figure 3B:
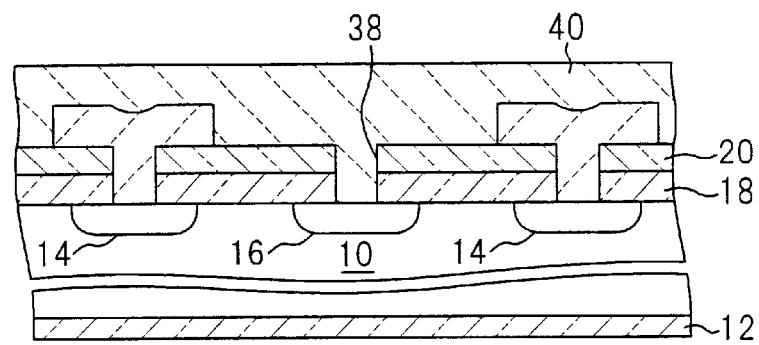
Figure 3C:
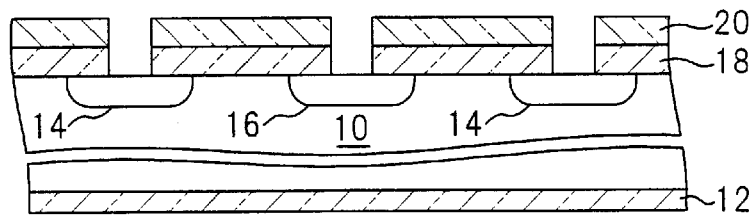

Thereafter, the process proceeds to S12 in which, as shown in FIG. 3B, a second plurality of opened windows 38 are formed between the first opened windows and boron-doped glass 40 is applied over the surface and into the new opened windows 38. The structure is then heated to a temperature of approximately 900° C. to 1150° C. such that dopants from the doped oxide layers (glasses) 36, 40 diffuse into the surface of the substrate 10 to form the n-doped regions 14 and the p-doped region 16. The substrate is then exposed to a silicon oxide etch to remove all of the exposed oxide layers (glasses) 36, 40 to obtain the structure illustrated in FIG. 3C.

Figure 3D:
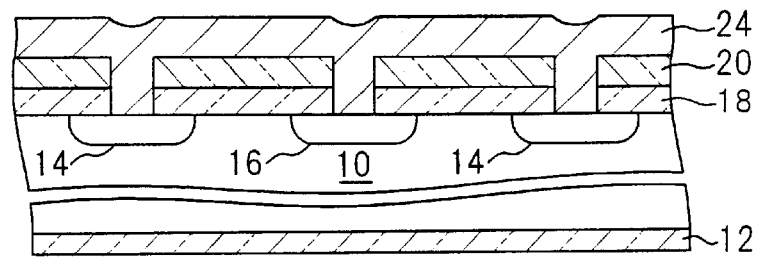
Figure 3E:
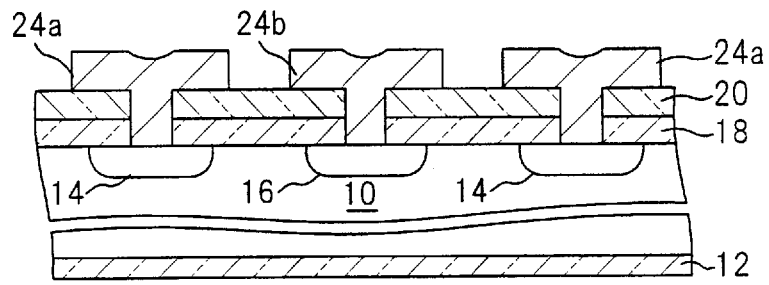

Then, the process proceeds to S14 in which the first metal layer 24 (e.g., sputtered aluminum) is deposited over the entire surface at the thickness of 2 to 4 µm to form contacts with all of the n-doped regions 14 and the p-doped region 16 as shown in FIG. 3D. The first metal layer 24 is then patterned and etched such that all of the doped regions 14, 16 have separate contacts as shown in FIG. 3E.

Before continuing the explanation of the method, the problem encountered in the fabrication in the prior art will again be referred to.

As mentioned above, since the concentration ratio (e.g., ×200 to 500, or incident power density of 20 to 50 W/cm$^2$) is great, the first metal layer 24 is very thick (e.g., 2 to 4 µm). The high thickness of the first metal layer 24 may sometimes make proper deposition of the second metal layer 28 (made of a metal stack at a thickness of 1 to 2 µm) over insulator layer 26 difficult, causing the second metal layer to have poor conductivity or worse, to break.

Figure 12:
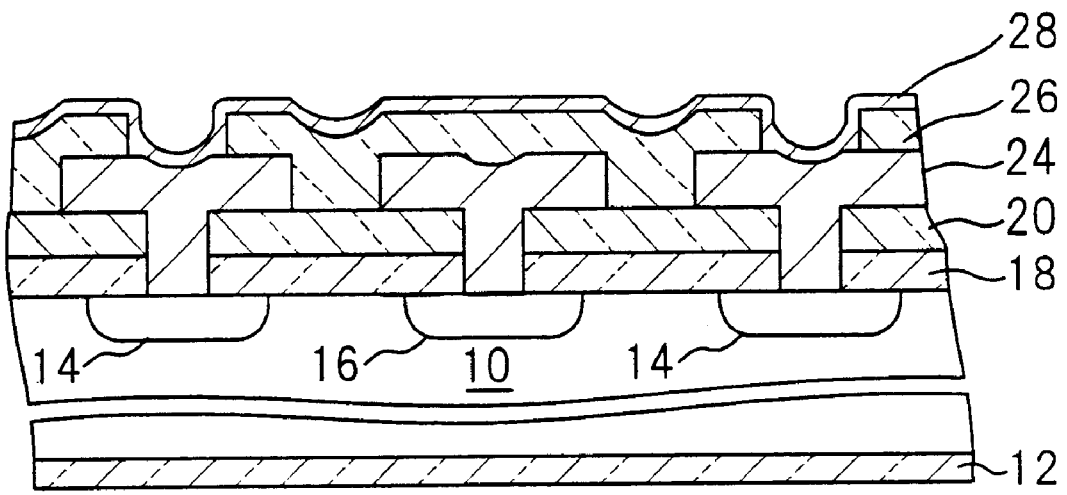
FIG. 12 is a schematic sectional view illustrating a problem occurred in the fabrication method described in the aforesaid U.S. patent.

In view of the above, instead of aluminum oxide, this embodiment is configured to use a resilient organic material such as polyimide as the material for the insulator layer 26. A thick layer of polyimide can smooth the surface above the first metal layer 24 and make it more planar. However, as shown in FIG. 12, the thick layer 26 is liable to rise at the edges of the opened windows, rendering the second metal layer 28 to become too thin or worse, to break. Therefore, it is very important that the thick insulator layer 26 is patterned in such a way that the edges are not abrupt and have a round shape.

Figure 3F:
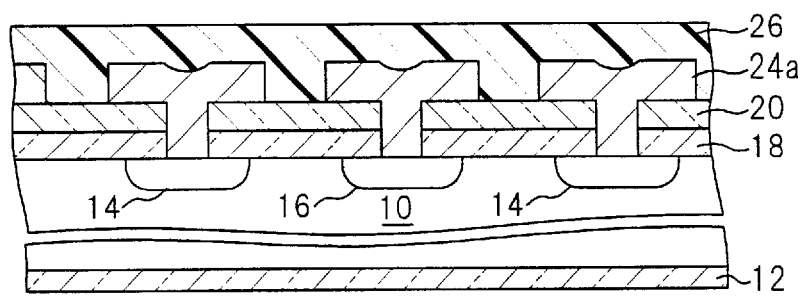

Returning to the explanation of the fabrication with reference to FIG. 2, after the first metal layer 24 is patterned, the process proceeds to S16 in which the thick layer 26 of polyimide (e.g., Hitachi PiX 3400 (trade mark)) is deposited over the first metal layer 24 to obtain a film thickness of approximately 5 μm, as shown in FIG. 3F.

Figure 3G:
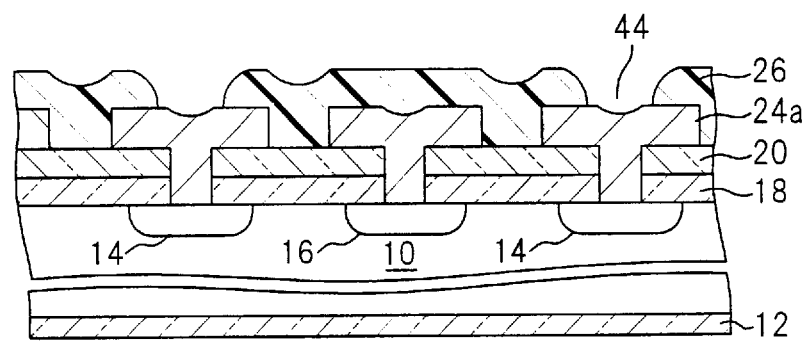

Then, after doing a pre-bake (pre-cure) to eliminate the solvents, the insulator layer 26 is patterned to have opened windows 44, as shown in FIG. 3G. More specifically, a thin layer of photoresist (e.g., Shipley 1813 (trade mark)) is applied and the photoresist is exposed to ultraviolet through a photolithography mask (not shown). Then, the photoresist is developed using a developer (e.g., Shipley M319 (trade mark)). In the development, the polyimide is also etched. Then, a solvent (e.g., n-butyl acetate) is applied to remove the photoresist. In doing this, care should be taken not to remove the necessary polyimide portion. Other solvents such as cellosolve acetate could be used for the same purpose.

The process then proceeds to S18 in which the structure is heated in a furnace to cure the insulator layer 26 of polyimide. More specifically, the structure is baked or heated (in air or nitrogen atmosphere) at 120° C. for 30 minutes, followed by another 30 minutes at 200° C., and followed by still another 1 hour at 350° C.

The process then proceeds to S20 in which the structure is additionally cured by being baked or heated (in air or nitrogen atmosphere) at an increased temperature up to 400° C. for 30 minutes. With this additional heating, the polyimide layer 26 is sufficiently cured and is contracted such that the edges at the opened windows 44 have round edges. In other words, the insulator layer 26 is relatively planarized and even.

It should be noted here that the temperature and time in the additional curing shown in S20 is an example that depends on the property or kind of the polyimide and the thickness of the insulator layer 26. The inventors have noted that increasing the time up to 1 hour at 400° C. was still effective for the purpose, but increasing the temperature to 500° C. made the insulator layer 26 too hard and resulted in cracking at the layer 26.

Figure 3H:
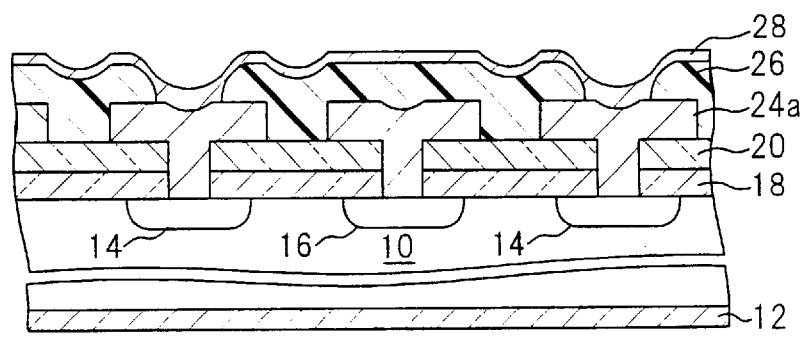

The process then proceeds to S22 in which the second metal layer 28 made of a metal stack (at the thickness of 1 to 2 μm) comprising aluminum/chromium/nickel/copper, is applied on the second insulator layer 26b and the first metal layer 24 such that the aluminum layer in the second metal layer 28 and the first metal layer 24 comprising aluminum are joined together by being annealed to form contacts as shown in FIG. 3H. Here, what is meant by the word 'annealing' is, contrary to what is understood in the field of metallurgy, the process of heating the aluminum layers at a temperature of e.g., 350° C. to 400° C. to join them together.

It should also be noted that, instead of the metal stack comprising Al/Cr/Ni/Cu, a metal stack comprising chromium/nickel/copper, or aluminum/titanium/nickel/silver, or aluminum/titanium/palladium/silver can be used.

Figure 3I:
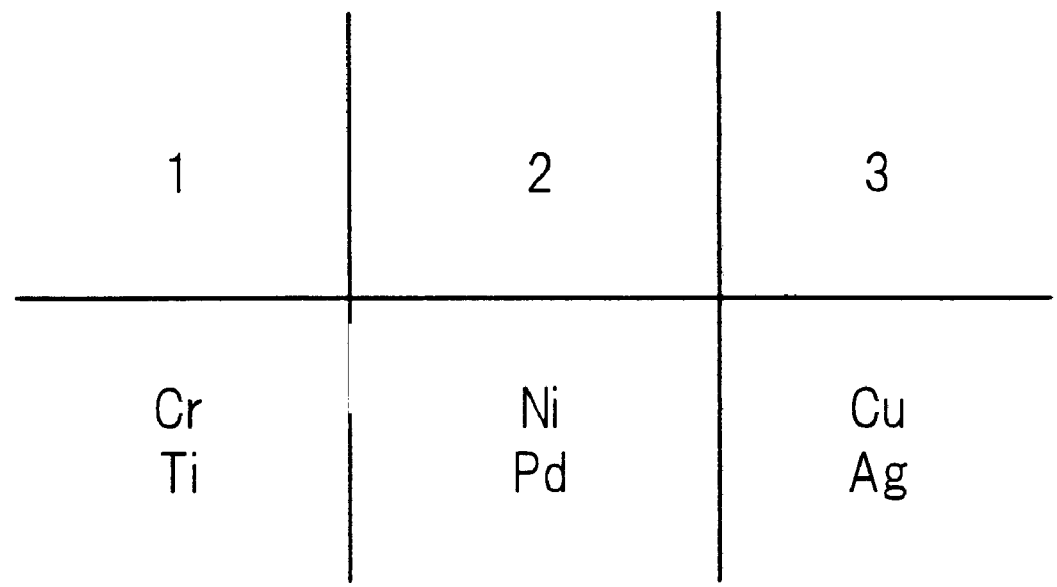
FIGS. 3I–3J are tables showing combination of metals to be used as the second metal layer (of FIG. 1B)
Figure 3J:
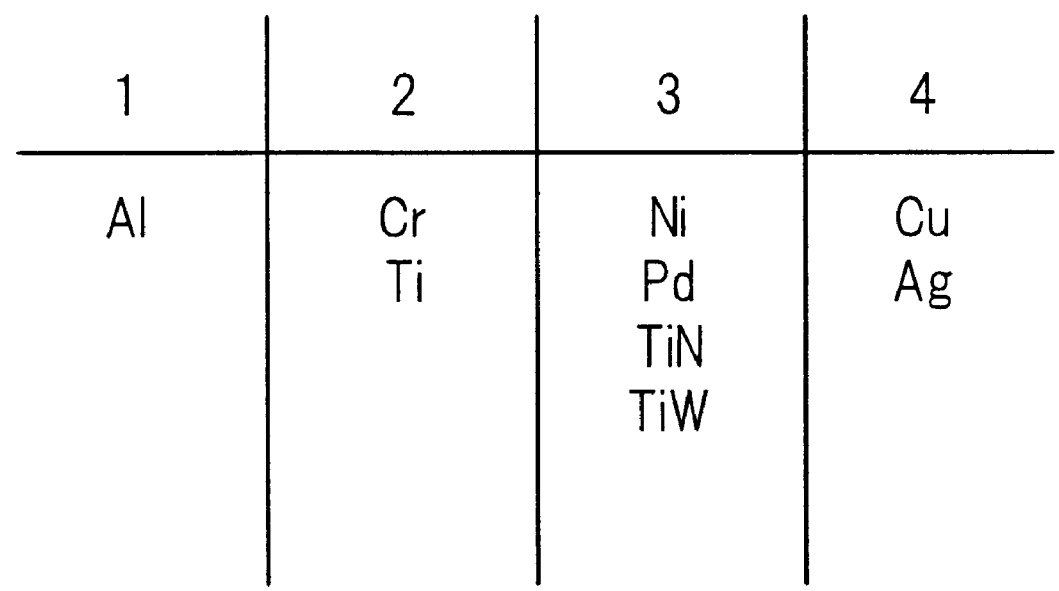

More specifically, the metal stack comprises an adhesion layer (innermost one to be adhered to the insulator layer 26) 1, a diffusion barrier 2 and a solderable metal (outermost one) 3, and as shown in FIG. 3I, any combination of metals from among the table can be used for them. Alternatively, the metal stack comprises a light reflectivity enhancement (innermost) 1, an adhesion layer 2, a diffusion barrier 3 and a solderable layer 4, and as shown in FIG. 3J, any combination can similarly be used.

It should be noted here that, for ease of understanding, in FIG. 1A, the first metal layer 24 is illustrated to come into contact with only the n-doped region, while the second metal layer 28 is shown to come into contact with only the p-doped region. The first and second metal layers are, in fact, brought into contact with the doped regions as illustrated in FIG. 3A etc.

Having been configured in the foregoing manner, the method according to this embodiment can present the back surface point contact silicon solar cell having a double layer of metallization, in which the cell surface to be soldered onto the metallized substrate 100 is well planarized and even to ensure sufficient conductibility, with less voids and less solder fatigue.

Figure 4:
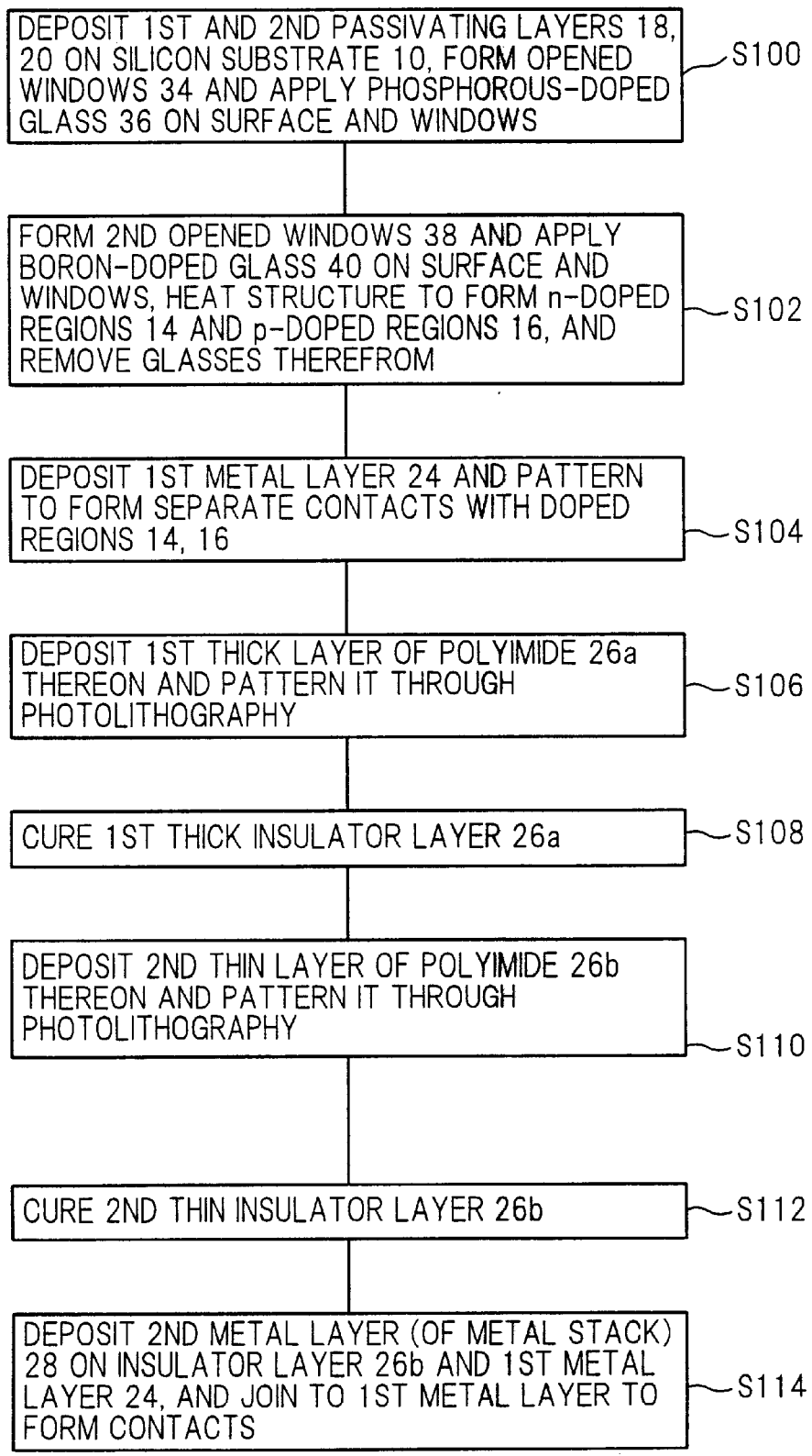
FIG. 4 is a view, similar to FIG. 2, but showing a process flow chart illustrating the process to fabricate the silicon solar cell (of FIG. 1B) according to a second embodiment of the invention.

FIG. 4 is a view, similar to FIG. 2, but showing the method of fabricating a back surface point contact silicon solar cell according to a second embodiment of the invention.

The single layer 26 of polyimide in the first embodiment is effective in planarizing the underlying topology created by the patterning of the first metal layer 24. However, the inventors have noted that the single layer 26 may sometimes create its own topology when it is in turn patterned to create the vias (conductors formed in the opened windows 44 in the insulator layer 26) for allowing the second metal layer 28 to come in contact with the first metal layer 24 in the selected locations. The inventors have found that, by depositing two layers of polyimide with a reduced thickness, the cell surface can be better planarized while only creating a small step after patterning.

The second embodiment aims to provide a method of fabricating a back surface point contact silicon solar cell with a higher level of planarization, even with very thick metallization.

Figure 5A:
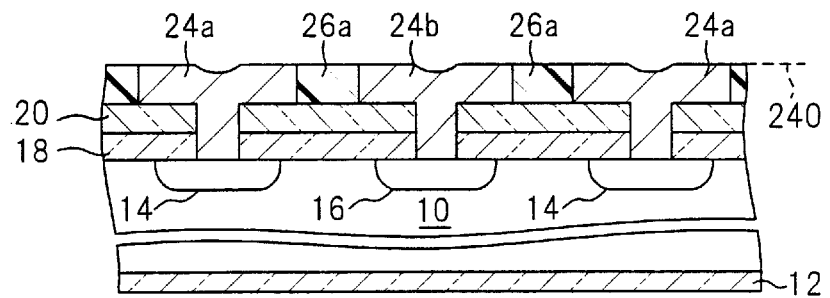
FIGS. 5A–5D are sectional views explaining the process shown in FIG. 4.
Figure 5B:
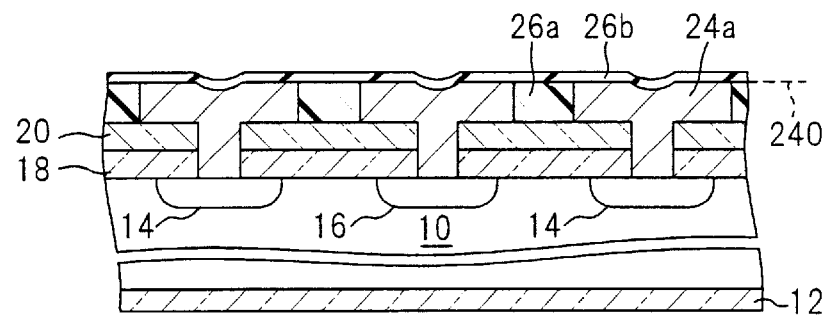

Explaining the method in the second embodiment with reference to FIG. 4, the process begins in S100 and proceeds, via S102, to S104 in which the first metal layer 24 of 2 to 4 μm of aluminum is patterned, and then proceeds to S106 in which a thick layer 26a of polyimide (e.g., Hitachi PiX 3400 (trade mark)) is deposited to obtain a film thickness of approximately 2 to 4 μm. Then, after doing a pre-bake (pre-cure) to eliminate the solvents, the thick layer 26a is patterned. Specifically, similar to the first embodiment, a thin layer of photoresist (e.g., Shipley 1813 (trade mark)) is formed on the polyimide layer 26 and the photoresist is exposed to ultraviolet through a photolithography mask (not shown). Then, the photoresist is developed using a developer (e.g., Shipley M319 (trade mark)), while etching the polyimide. The patterning and etching are conducted in such a way that the polyimide film 26a does not encroach (exceed) on top 240 of the first metal layer 24, as shown in FIG. 5A. Then, a solvent (e.g., n-butyl Acetate) is applied to remove the photoresist. In doing this, care should be taken not to remove the required pattern portion of polyimide. Other solvents such as cellosolve acetate could be used for the same purpose.

The process then proceeds to S108 in which the structure is heated in a furnace to cure the insulator layer 26a of polyimide. More specifically, the structure is baked or heated (in air or nitrogen atmosphere) at 120° C. for 30 minutes, followed by another 30 minutes at 200° C., and followed by still another 1 hour at 350° C.

It should be noted here that the process in S108 is optional and can be omitted if desired.

Figure 5C:
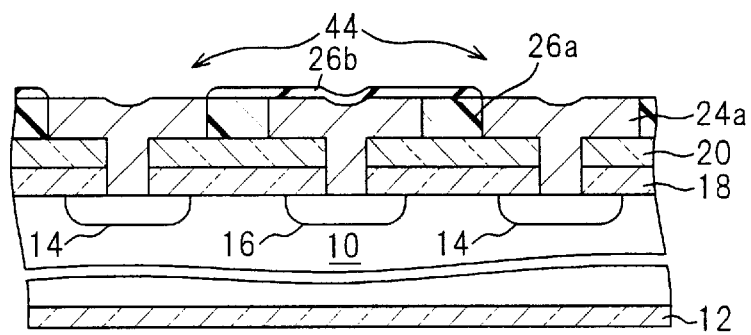

The process then proceeds to S110 in which a second layer of polyimide 26b is deposited over the first layer of polyimide 26 at a much higher speed. The material of the polyimide used in the second layer 26b is the same as that of the first layer 26a, but a less viscous polyimide is used to form a much thinner polyimide layer of approximately 1 μm. The second layer 26b is then patterned and etched in the same way as the first layer 26a, except that the second layer 26b must encroach a little bit on top 240 of the first metal layer 24. The first and second insulator layers 26a, 26b are patterned and etched to have the opened windows 44 as shown in FIG. 5C.

The process then proceeds to S112 in which the second layer 26b is cured in the same manner as the first layer 26a.

Figure 5D:
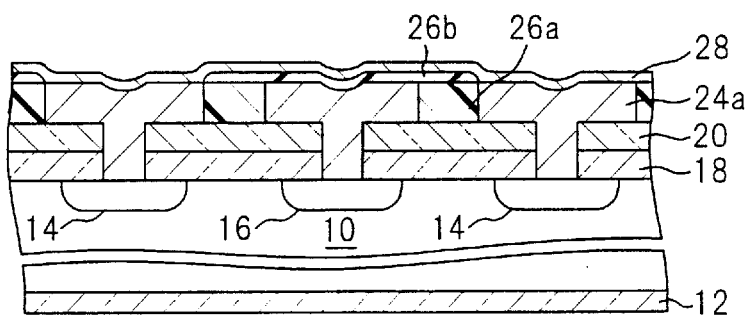

The process then proceeds to S114 in which the second metal layer 28 made of a metal stack (at the thickness of 1 to 2 µm) similar to that described in the first embodiment is applied on the second insulator layer 26b and the first metal layer 24 such that the aluminum layer in the second metal layer 28 and the first metal layer 24 comprising aluminum are joined together by being annealed to form contacts as shown in FIG. 5D.

Having been configured in the foregoing manner, since the polyimide application is made twice in the second embodiment, it makes easier to obtain the required thickness of the polyimide layer throughout the surface. As a result, a more planarized intermetal insulator surface is achieved with less raised edges. The planarized surface also improves the later soldering process with less voids, reduces the stress in the metallized substrate 100 and decreases the reliability problem of solder fatigue.

Figure 6:
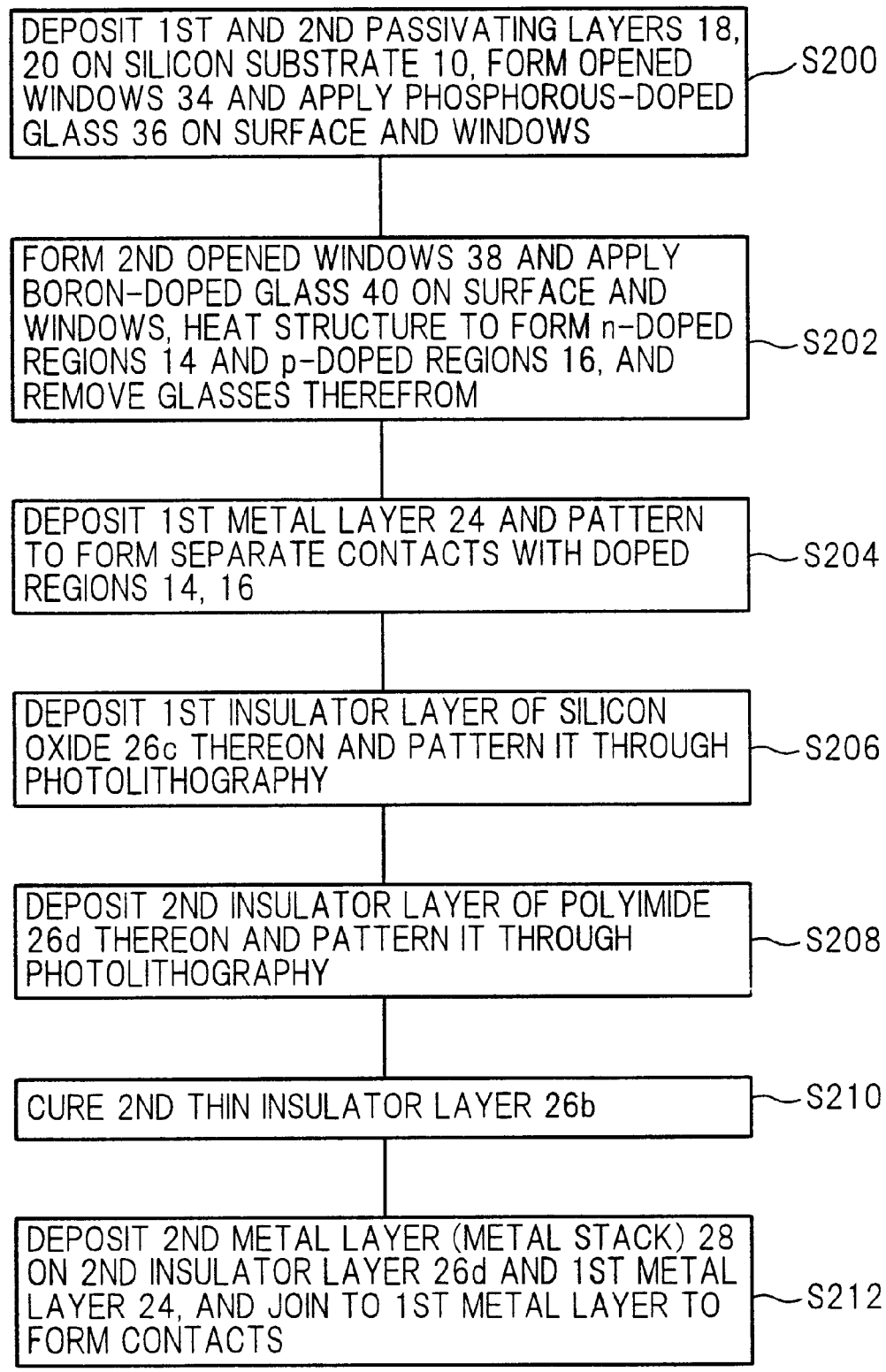
FIG. 6 is a view, similar to FIG. 2, but showing a process flow chart illustrating the process to fabricate the silicon solar cell (of FIG. 1B) according to a third embodiment of the invention.

FIG. 6 is a view, similar to FIG. 2, but showing the method of fabricating a back surface point contact silicon solar cell according to a third embodiment of the invention.

The third embodiment is an extension of the first embodiment or second embodiment, in which a double layer of silicon oxide and polyimide is used as the insulator intermetal layer such that the defects (drawbacks) of the materials are to a certain extent overcome.

More specifically, the oxide layer provides a barrier against moisture that protects the first layer aluminum connections, whereas the polyimide layer provides planarization and mechanical protection before the second metal layer deposition. Thus, it is effective to use such a double layer of an organic material (having resilience such as polyimide) and an inorganic material (such as silicon oxide) in obtaining a planarized surface better matched to the soldering base for the metallized substrate 100.

FIG. 7 is a table showing the comparison of characteristics of the materials to be used in the insulator layer. Thus, it can be seen that by combining these two materials, resulting in the use of a double layer, the defects of these materials are to a certain extent overcome, resulting in a robust structure for the solder fatigue.

Figure 8A:
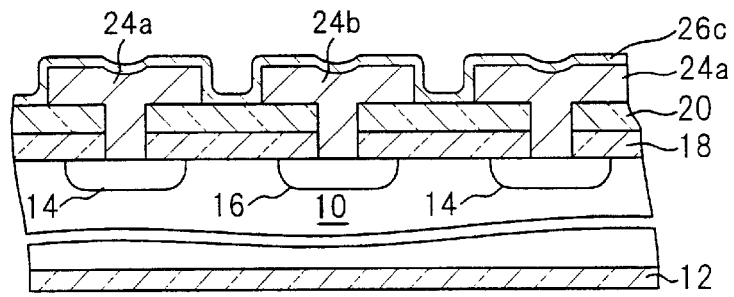
FIGS. 8A–8D are sectional views explaining the process shown in FIG. 6.

Explaining the method in the third embodiment with reference to FIG. 6, the process begins in S200 and proceeds, via S202, to S204 in which the first metal layer 24 of 2 to 4 µm aluminum is patterned, and proceeds to S206 in which a first insulator layer 26c of silicon oxide ($SiO_2$) is deposited over the first metal layer 24 to obtain a film thickness of approximately 1 µm, as shown in FIG. 8A.

Figure 8B:
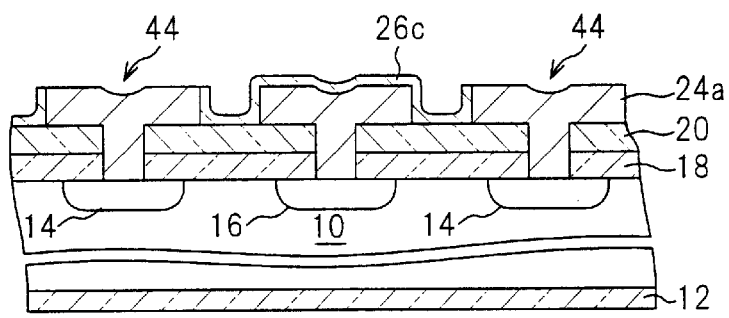

This is done by using plasma-enhanced CVD (Chemical Vapor Deposition) at 380° C. In order to deposit silicon oxide, other methods such as low-pressure CVD at 400° C. or atmospheric-pressure CVD at 450° C. can instead be used. Then, the first insulator layer 26c is patterned through photolithography to have the opened windows 44 therethrough, as shown in FIG. 8B.

Figure 8C:
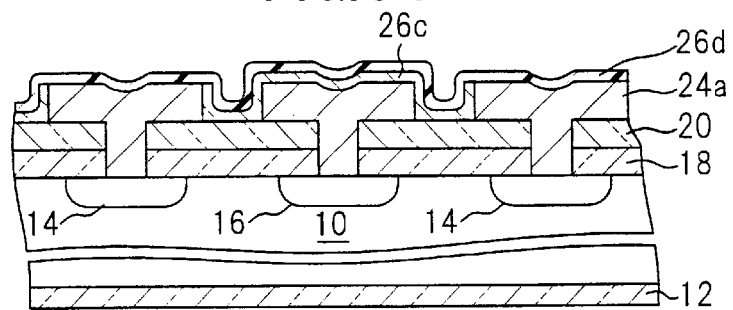

The process then proceeds to S208 in which a second insulator layer of polyimide 26d is deposited over the first layer of silicon oxide 26c, as shown in FIG. 8C, to obtain a film thickness of approximately 2.5 µm. Then, the second layer of polyimide is patterned and etched through photolithography.

Then the process proceeds to S210 in which the structure is heated in a furnace to cure the second insulator layer of polyimide 26d. More specifically, the structure is baked or heated (in air or nitrogen atmosphere) at 120° C. for 30 minutes, followed by another 30 minutes at 200° C., and followed by still another 1 hour at 350° C.

Figure 8D:
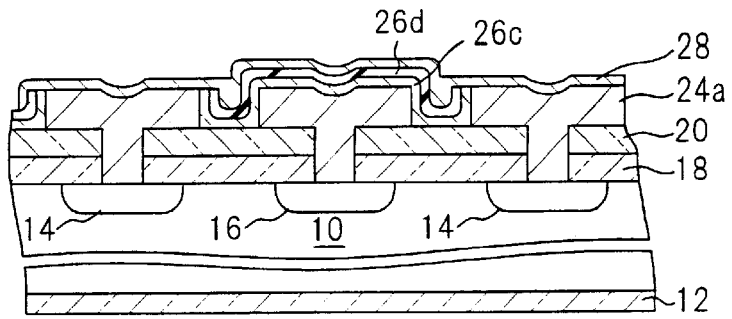

The process then proceeds to S212 in which the second metal layer 28 made of a metal stack similar to that mentioned in the first embodiment is applied on the second insulator layer 26d and the first metal layer 24 such that the aluminum layer in the second metal layer 28 and the first metal layer 24 comprising aluminum are joined together by being annealed to form contacts as shown in FIG. 8D.

It should be noted here that as the inorganic material, $Si_3O_4$ or $SiOxNy$ or $Al_2O_3$ can be used for the first insulator layer 26c, instead of $SiO_2$.

Having been configured in the foregoing manner, the double layer comprising the organic and inorganic material used in the third embodiment can present a planarized surface better matched to the soldering base for the metallized substrate 100.

Figure 9:
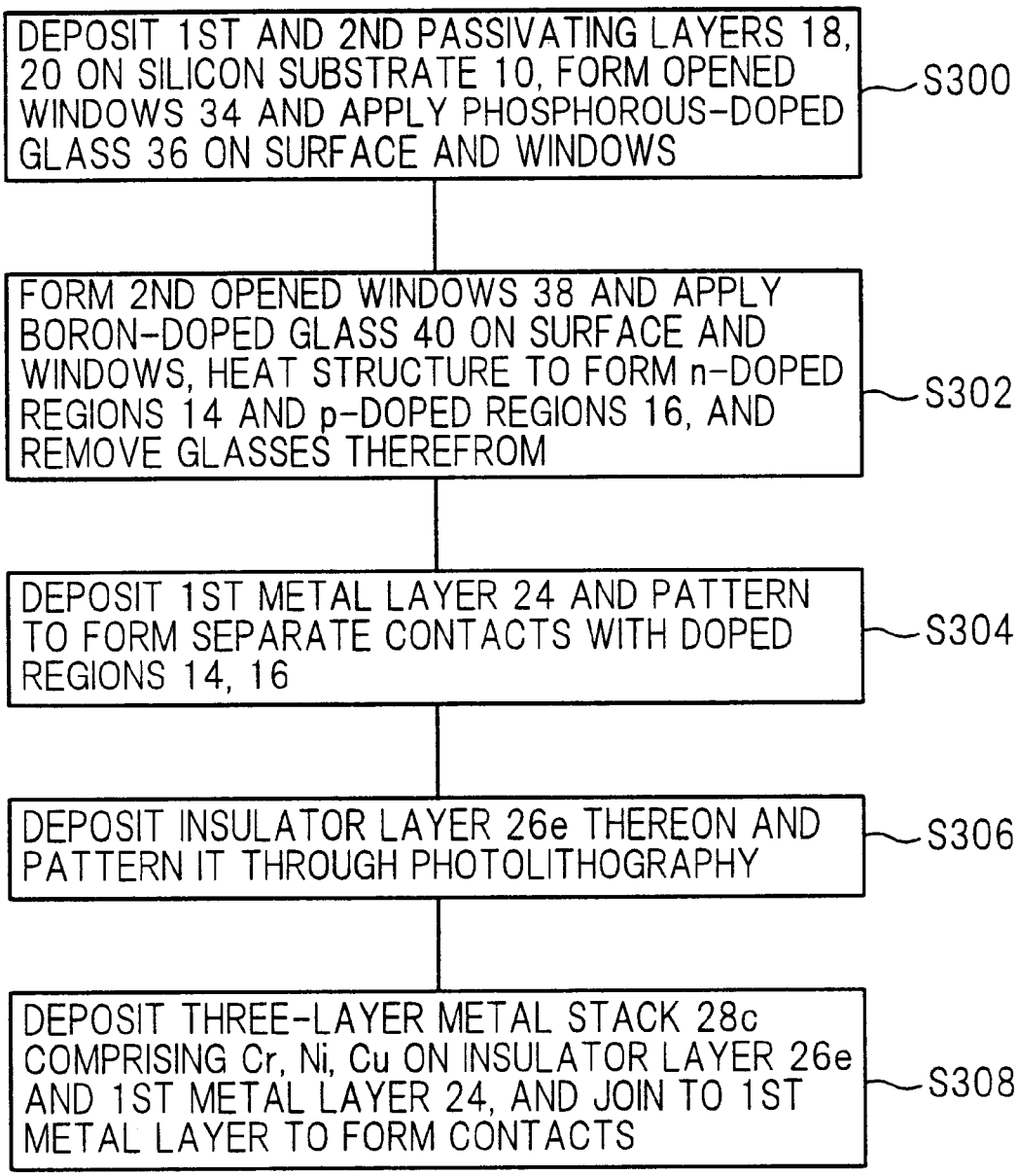
FIG. 9 is a view, similar to FIG. 2, but showing a process flow chart illustrating the process to fabricate the silicon solar cell (of FIG. 1B) according to a fourth embodiment of the invention.

FIG. 9 is a view, similar to FIG. 2, but showing the method of fabricating a back surface point contact silicon solar cell according to a fourth embodiment of the invention.

In the first embodiment, in order to join the second layer 28 to the first metal layer 24, the aluminum layers are annealed at 350° C. to 400° C. This sometimes causes topology (unevenness) to happen on the second metal layer 28 due to expansion of aluminum, making the deposition of chromium on the aluminum layer difficult, thereby degrading the conductivity.

In view of the above, in the fourth embodiment, the second metal layer is made of a three layer metal stack comprising materials other than aluminum, so as to provide a contact pad that can be easily soldered onto the metallized substrate 100 to obtain an improved conductivity.

Figure 10A:
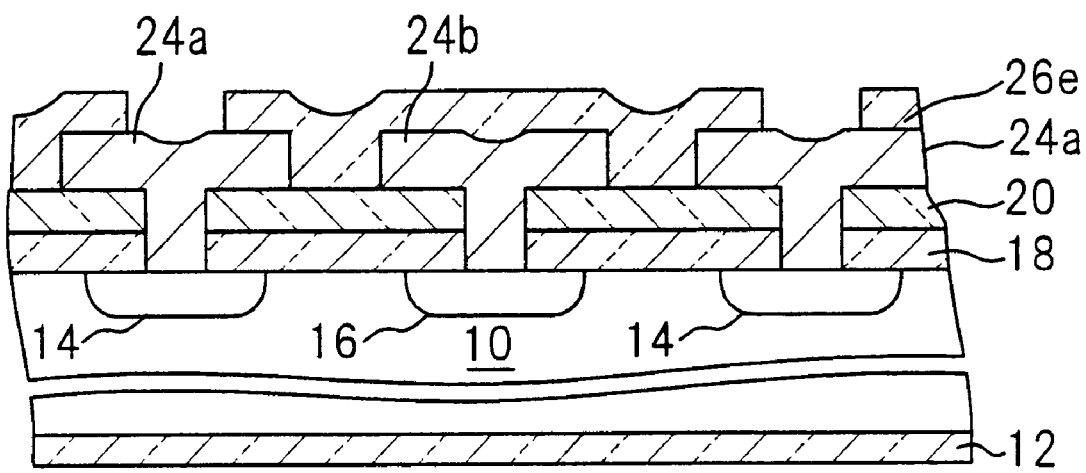
FIGS. 10A–10B are sectional views explaining the process shown in FIG. 6.
Figure 10B:
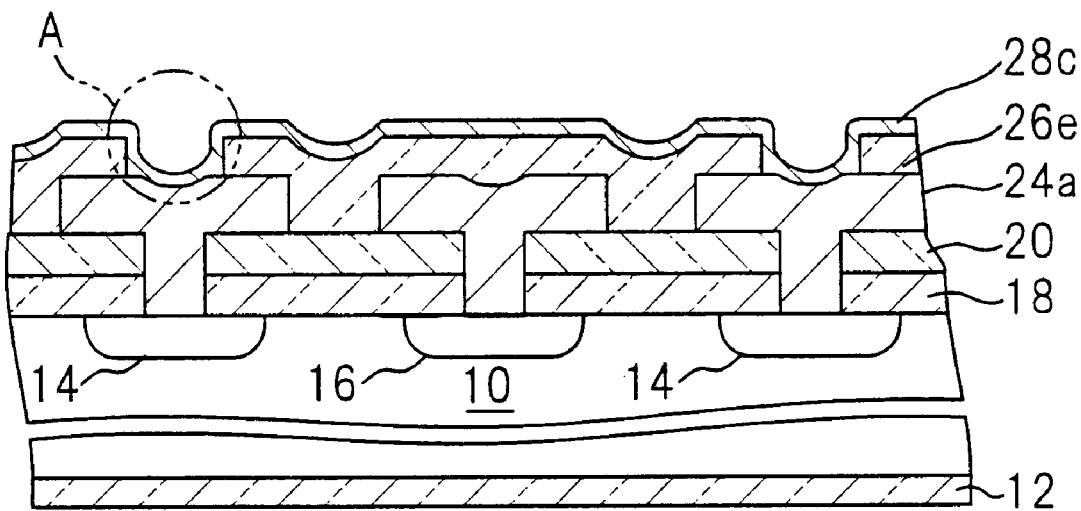

Explaining the method according to the fourth embodiment with reference to FIG. 9, the process begins in S300 and proceeds, via S302, S304, to S306 in which an insulator layer 26e is applied using one of the first to third embodiments as shown in FIG. 10A, and proceeds to S308 in which a second metal layer 28c made of a three-layer of metal stack comprising a material other than aluminum, is applied on the insulator layer 26e and the first metal layer 24 as shown in A FIG. 10B.

Figure 11:
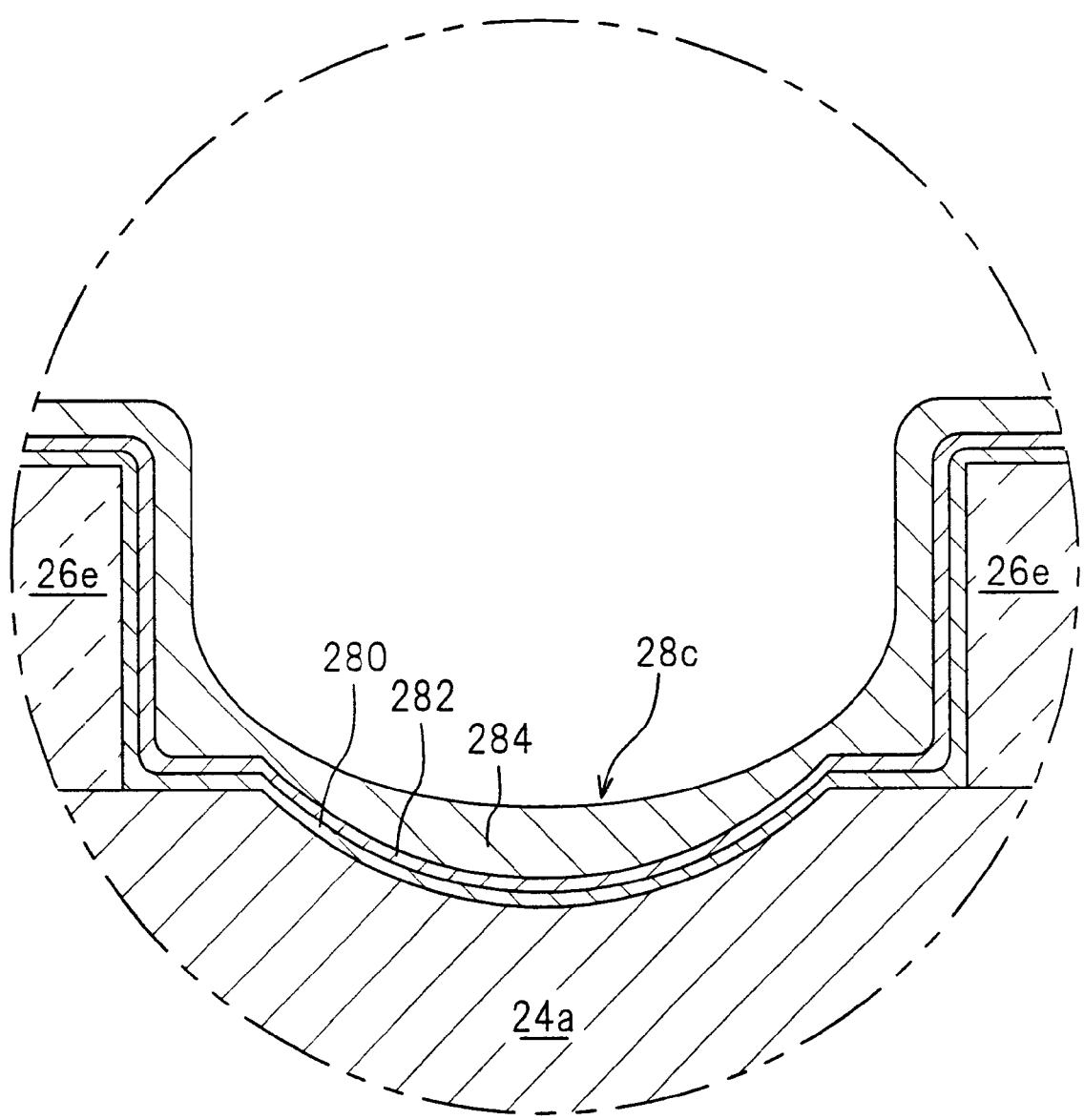
FIG. 11 is a an enlarged view of portion A in FIG. 10B.

As shown in FIG. 11, the second metal layer 28c comprises a first layer 280, a second layer 282 and a third layer 284. The first layer 280 comprises chromium (at the thickness of approximately 0.05 µm) and provides adhesion to the aluminum connections n the first metal layer 24 and to the insulator layer of polyimide.

The second layer 282 comprises nickel (at the thickness of approximately 0.2 to 0.4 µm) and acts as a diffusion barrier for the third layer 284 and for the solder. The third layer 284 comprises copper (at the thickness of approximately 0.6 to 1 µm) which is solderable. The usage of copper has the advantage that it prevents the dissolving of nickel during the later solder process.

Specifically the first layer 280 is applied on the insulator 26e through sputtering deposition, then the second layers 282 is applied on the first layer 280 through sputtering deposition, and then the third layer 284 is applied on the second layer 282 through sputtering deposition.

It should be noted here that the first layer 280, the second layer 282 and the third layer 284 can be applied through sputtering or evaporation with shadow mask or using lift off technology or through deposition, followed by photolithography and etching.

It should also be noted here that, instead of Cr/Ni/Cu, a metal stack comprising chromium/nickel/silver can be used.

Having been configured in the foregoing manner, the three-layer metal stack used in the fourth embodiment can provide a smooth planarized surface. In addition, since the three-metal stack second layer can thus be applied with sufficient respective thicknesses, the structure is made robust, thereby improving the service life of the cell. The configuration can also present better solderability for the metallized substrate.

It should be noted in the above that, although the invention is described with reference to the first to fourth embodiments, taking the back surface point contact silicon solar cell as an example, the invention can be applied to other types of solar cell.

It should also be noted in the above that, although the substrate 10 is coated with the first passivating layer 18 and the second passivating layer 20, the second passivating layer 20 can be omitted.

Although the invention has thus been shown and described with reference to specific embodiments, it should be noted that the invention is in no way limited to the details of the described arrangements but changes and modifications may be made without departing from the scope of the invention which is defined by the appended claims.

What is claimed is:

1. A method of fabricating a silicon solar cell having p-doped regions and n-doped regions on a same side, comprising the steps of:
    (a) forming a passivating layer on a surface of the cell having opened windows at the p-doped regions and the n-doped regions;
    (b) depositing and patterning a first metal layer on the passivating layer in such was that the first metal layer comes into contact with the p-doped regions and the n-doped regions;
    (c) depositing an insulator layer of polyimide on the first metal layer;
    (d) etching and patterning the insulator layer of polyimide in such a way that the insulator layer has opened windows at, at least one of the p-doped regions and the n-doped regions;
    (e) curing the insulator layer of polyimide by heating at a predetermined first temperature for a predetermined first time;
    (f) additionally curing the insulator layer of polyimide by heating at a predetermined second temperature, which is higher than the predetermined first temperature, for a predetermined second time; and
    (g) depositing a second metal layer on the insulator layer of polyimide in such a way that the second metal layer comes into contact with one of the p-doped regions and the n-doped regions; and
    wherein the predetermined second temperature in step (f) is a temperature ranging from 400° C. to 500 °C.

2. A method of fabricating a silicon solar cell having p-doped regions and n-doped regions on a same side, comprising the steps of:
    (a) forming a passivating layer on a surface of the cell having opened windows at the p-doped regions and the n-doped regions;
    (b) depositing and patterning a first metal layer on the passivating layer in such was that the first metal layer comes into contact with the p-doped regions and the n-doped regions;
    (c) depositing an insulator layer of polyimide on the first metal layer;
    (d) etching and patterning the insulator layer of polyimide in such a way that the insulator layer has opened windows at, at least one of the p-doped regions and the n-doped regions;
    (e) curing the insulator layer of polyimide by heating at a predetermined first temperature for a predetermined first time;
    (f) additionally curing the insulator layer of polyimide by heating at a predetermined second temperature, which is higher than the predetermined first temperature, for a predetermined second time; and
    (g) depositing a second metal layer on the insulator layer of polyimide in such a way that the second metal layer comes into contact with one of the p-doped regions and the n-doped regions; and
    wherein the second metal layer is deposited in step (g) at a thickness which is smaller than a thickness of the first metal layer deposited in step (b) and a thickness of the insulator of polyimide deposited in step (c).

3. A method of fabricating a silicon solar cell having p-doped regions and n-doped regions on a same side, comprising the steps of:
    (a) forming a passivating layer on a surface of the cell having opened windows at the p-doped regions and the n-doped regions;
    (b) depositing and patterning a first metal layer on the passivating layer in such was that the first metal layer comes into contact with the p-doped regions and the n-doped regions;
    (c) depositing an insulator layer of polyimide on the first metal layer;
    (d) etching and patterning the insulator layer of polyimide in such a way that the insulator layer has opened windows at, at least one of the p-doped regions and the n-doped regions;
    (e) curing the insulator layer of polyimide by heating at a predetermined first temperature for a predetermined first time;
    (f) additionally curing the insulator layer of polyimide by heating at a predetermined second temperature, which is higher than the predetermined first temperature, for a predetermined second time; and
    (g) depositing a second metal layer on the insulator layer of polyimide in such a way that the second metal layer comes into contact with one of the p-doped regions and the n-doped regions; and
    wherein the second layer is made of a metal stack comprising an adhesion layer, diffusion barrier and a solderable metal.

4. A method of fabricating a silicon solar cell having p-doped regions and n-doped regions on a same side, comprising the steps of:
    (a) forming a passivating layer on a surface of the cell having opened windows at the p-doped regions and the n-doped regions;
    (b) depositing and patterning a first metal layer on the passivating layer in such was that the first metal layer comes into contact with the p-doped regions and the n-doped regions;

(c) depositing an insulator layer of polyimide on the first metal layer;

(d) etching and patterning the insulator layer of polyimide in such a way that the insulator layer has opened windows at, at least one of the p-doped regions and the n-doped regions;

(e) curing the insulator layer of polyimide by heating at a predetermined first temperature for a predetermined first time;

(f) additionally curing the insulator layer of polyimide by heating at a predetermined second temperature, which is higher than the predetermined first temperature, for a predetermined second time; and (g) depositing a second metal layer on the insulator layer of polyimide in such a way that the second metal layer comes into contact with one of the p-doped regions and the n-doped regions; and wherein the second layer is made of a metal stack comprising a light reflective enhancement, an adhesion layer, a diffusion barrier and solderable metal.

* * * * *